(12) United States Patent
Amon et al.

(10) Patent No.: US 7,679,120 B2
(45) Date of Patent: Mar. 16, 2010

(54) METHOD FOR THE PRODUCTION OF A SEMICONDUCTOR SUBSTRATE COMPRISING A PLURALITY OF GATE STACKS ON A SEMICONDUCTOR SUBSTRATE, AND CORRESPONDING SEMICONDUCTOR STRUCTURE

(75) Inventors: Jurgen Amon, Dresden (DE); Jurgen Faul, Radebeul (DE); Thomas Ruder, Dresden (DE); Thomas Schuster, Dresden (DE)

(73) Assignee: Qimonda, AG, Munich (DE)

( * ) Notice: Subject to any disclaimer, the term of this patent is extended or adjusted under 35 U.S.C. 154(b) by 262 days.

(21) Appl. No.: 11/513,447

(22) Filed: Aug. 31, 2006

(65) Prior Publication Data
US 2007/0205437 A1 Sep. 6, 2007

Related U.S. Application Data

(60) Division of application No. 11/010,941, filed on Dec. 10, 2004, now Pat. No. 7,118,955, which is a continuation of application No. PCT/EP03/05581, filed on May 27, 2003.

(30) Foreign Application Priority Data
Jun. 26, 2006 (DE) ................. 102 28 571

(51) Int. Cl.
*H01L 27/108* (2006.01)

(52) U.S. Cl. ............... 257/301; 257/388; 257/E21.626; 257/E27.092

(58) Field of Classification Search ................. 438/421; 257/301, 388, E21.626, E27.092
See application file for complete search history.

(56) References Cited

U.S. PATENT DOCUMENTS

| | | | | |
|---|---|---|---|---|
| 5,192,702 A * | 3/1993 | Tseng | ......................... | 438/253 |
| 5,700,731 A * | 12/1997 | Lin et al. | ..................... | 438/381 |
| 5,716,862 A * | 2/1998 | Ahmad et al. | ............... | 438/303 |
| 6,468,877 B1 * | 10/2002 | Pradeep et al. | .............. | 438/421 |
| 6,972,220 B2 * | 12/2005 | Bertin et al. | ................. | 438/152 |
| 2002/0151134 A1 * | 10/2002 | Kunikiyo | ..................... | 438/254 |
| 2006/0125122 A1 * | 6/2006 | Roizin et al. | ................. | 257/900 |
| 2006/0194381 A1 * | 8/2006 | Wei et al. | ..................... | 438/197 |
| 2008/0023775 A1 * | 1/2008 | Nowak | ........................ | 257/384 |

* cited by examiner

*Primary Examiner*—Mary Wilczewski
*Assistant Examiner*—Toniae M Thomas
(74) *Attorney, Agent, or Firm*—Fay Kaplun & Marcin, LLP

(57) ABSTRACT

A semiconductor structure having a plurality of gate stacks on a semiconductor substrate provided with a gate dielectric. The gate stacks have a lower first layer made of polysilicon, an overlying second layer made of a metal silicide, and an upper third layer made of an insulating material, and a sidewall oxide on the sidewalls of the first and second layers. The sidewall oxide is thinned or removed on one of the sidewalls, and the gate stacks have sidewall spacers made of the insulating material.

4 Claims, 5 Drawing Sheets

METHOD FOR THE PRODUCTION OF A SEMICONDUCTOR SUBSTRATE COMPRISING A PLURALITY OF GATE STACKS ON A SEMICONDUCTOR SUBSTRATE, AND CORRESPONDING SEMICONDUCTOR STRUCTURE

RELATED APPLICATIONS

This application is a divisional patent application which claims the benefit of the filing date of U.S. patent application Ser. No. 11/010,941, filed Dec. 10, 2004 now U.S. Pat. No. 7,118,955, which is a continuation of PCT patent application number PCT/EP2003/005581, filed May 27, 2003, which claims priority to German patent application number 10228571.3, filed Jun. 26, 2002, the disclosures of each of which are incorporated herein by reference in their entirety.

TECHNICAL FIELD

The present invention relates to a method for the production of a semiconductor structure comprising a plurality of gate stacks on a semiconductor substrate, and to a corresponding semiconductor structure.

BACKGROUND ART

U.S. Pat. No. 6,080,613 discloses a semiconductor structure comprising a plurality of gate stacks, the gate stacks having thinned sidewall spacers made of silicon oxide.

U.S. Pat. No. 5,439,835 discloses the use of a mask for forming sidewall spacers on gate stacks.

U.S. Pat. No. B1-6,383,863 discloses gate stacks comprising caps made of silicon nitrite.

Although applicable in principle to any desired integrated circuits, the present invention and the problem area on which it is based are explained with regard to integrated DRAM memory circuits in silicon technology.

The memory cells of integrated DRAM memory circuits comprise a bit line contact, a selection transistor and a storage capacitor. The capacitor may be embodied as a trench capacitor or as a stacked capacitor above the gate lines.

The bit line contacts are etched in a self-aligning manner between gate lines arranged in strip-type fashion and are subsequently filled with a conductive material, metal or highly doped polysilicon. In specific designs, a bit line contact is used for two adjacent memory cells which likewise has a space-saving effect.

As memory cell dimensions decrease, the lateral opening of the bit line contacts also becomes smaller and smaller since the distance between the gate lines decreases. Therefore, considerable efforts have to be made in order to keep the resistance of the bit line contact plug small, which is achieved for example by changing from a polysilicon filling to a suitable metal filling (e.g.) tungsten).

It is also a central problem to find a suitable etching for the bit line contact, that is to say an etching of doped $SiO_2$ selectively with respect to the silicon nitride covering the gate lines, the etching ensuring an opening of the bit line contact hole without damaging the gate lines or the insulation thereof. This is critical in particular owing to the process and thickness fluctuations occurring in the layers that form or insulate the gate lines.

What are particularly critical are the width of the gate line stacks, the thickness of the side wall spacer and also the thickness of a liner made of silicon nitride that functions as a diffusion barrier in order to avoid impurities of the doped $SiO_2$ in the gate lines.

In the case of the 110 nm technology, by way of example, taking account of these process and thickness fluctuations, a fluctuation range of 45 nm to 75 nm remains for the width of a respective bit line contact.

Considerable efforts have been made heretofore in order, by way of example, to optimize the aforementioned self-aligned contact hole etching of the doped $SiO_2$ for the bit line contacts. A principal difficulty consists in the fact that the lateral dimensions are reduced by the shrink factor but the height of the gate stack is scarcely reduced. This increasingly worsens the so-called aspect ratio (height/width) for the critical contact hole etching.

Nowadays the etching process is realized by a two-stage etching. In the first step, etching is effected as far as possible perpendicularly anisotropically as far as the silicon nitride cap, and, in the second step, etching is effected as far as possible selectively with respect to the silicon nitride cap, in which case the profile of the upper region of the contact hole should as far as possible not be expanded.

Reducing the material thicknesses for the individual constituent parts of the gate line stack likewise requires considerable efforts. By way of example, it is known that even only slightly reducing the thickness of the side wall oxide considerably impairs the leakage current behavior of the selection transistors, with the result that the required retention time of the memory signal in the storage capacitor can no longer be guaranteed.

The problem area on which the present invention is based consists in alleviating the space problem for the bit line contacts.

DISCLOSURE OF THE INVENTION

The particular advantages of the production method according to the invention and of the corresponding semiconductor structure are that the alleviated space conditions mean that it is possible to achieve a reduction of the short-circuit problem area during the contact hole etching, with the result that the yield in the process, for example in the DRAM fabrication process, can be significantly increased. Furthermore, the invention affords the possibility of further shrinks.

The idea on which the present invention is based consists in increasing the lateral width for the bit line contact by single-sided reduction of the sidewall oxide on the side of the bit line contact, that is to say on that side of the selection transistor which is remote from the storage capacitor of the respective memory cell. In other words, the sidewall oxide on the selection transistor is configured asymmetrically, that is to say thicker on the side of the storage capacitor and thinner on the side of the bit line contact.

For this purpose, the sidewall oxide on the bit line side of the selection transistor may be merely thinned or completely removed, as a result of which the lateral opening for the bit line contact can be enlarged by at most twice the width of the sidewall oxide.

In the 110 nm technology, by way of example, the thickness of the sidewall oxide amounts to 2×12 nm=24 nm. That is to say that given a lateral width of the bit line contact of 45 nm to 75 nm, the maximum lateral space gain corresponds to 53% to 32% of the current lateral width of the bit line contact, which means a considerable alleviation for the self-aligned contact hole etching.

In this case, the sidewall oxide on the selection transistor on the side of the storage capacitor is left unchanged by virtue of a suitable masking, which has the effect that it is possible to avoid an impairment of the leakage current behavior of the memory cell.

Advantageous developments and improvements of the respective subject matter of the invention are found in the subclaims.

In accordance with one preferred development, the gate stacks are provided in parallel strip-type fashion on the semiconductor substrate.

In accordance with a further preferred development, the gate stacks are provided with approximately the same configuration and approximately the same spacing on the semiconductor substrate.

In accordance with a further preferred development, the active regions of the selection transistors are provided in a self-aligning manner in the interspace between the gate stacks.

In accordance with a further preferred development, the removal of the sidewall oxide on the sidewalls of the gate stacks serving as a control electrode takes place using a mask.

In accordance with a further preferred development, the sidewall oxide is removed on opposite sidewalls of adjacent gate stacks above respective active regions which simultaneously serve as a connection for two selection transistors.

In accordance with a further preferred development, a respective bit line contact is formed between sidewalls of adjacent gate stacks with an at least partly removed sidewall oxide.

In accordance with a further preferred development, the gate stacks are created by carrying out an application and patterning of the first, the overlying second and the upper third layer on the gate dielectric.

In accordance with a further preferred development, the third layer is a silicon nitride layer.

An exemplary embodiment of the invention is illustrated in the drawings, and explained in more detail in the description below.

BRIEF DESCRIPTION OF THE DRAWINGS

In FIGS. 1-5, identical reference symbols designate identical or functionally identical constituent parts.

DETAILED DESCRIPTION OF THE INVENTION

Figure 1:
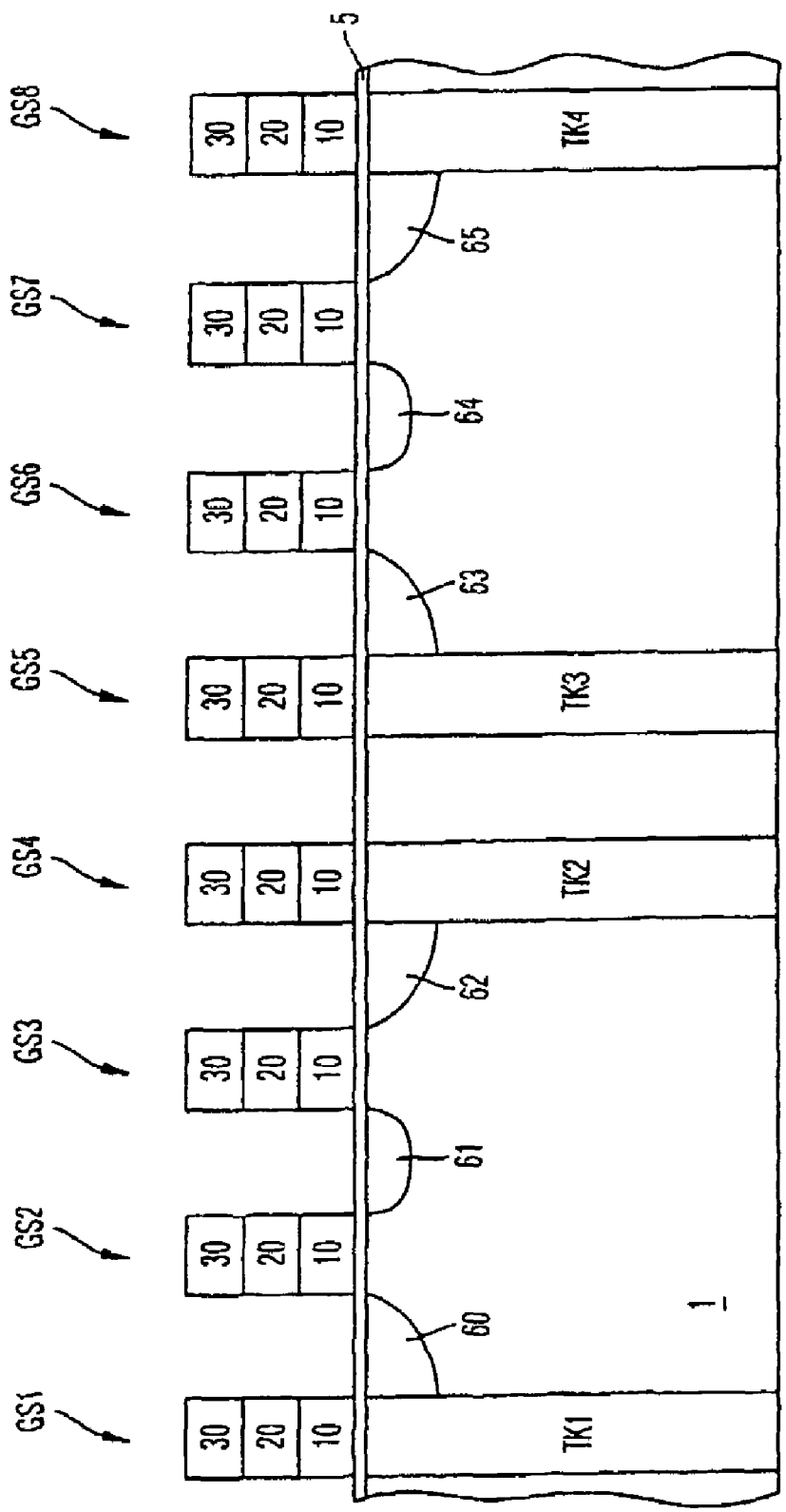
FIGS. 1-5 show diagrammatic illustrations of successive method stages of the method for the production of a semiconductor structure comprising a plurality of gate stacks on a semiconductor substrate as an embodiment of the present invention.

In FIG. 1, reference symbol 1 designates a silicon semiconductor substrate, in which trench capacitors TK1, TK2, TK3, TK4 for corresponding memory cells are provided. Reference symbols 60 to 65 designate doping regions introduced into the semiconductor substrate 1, which are drain and source regions of the selection transistors shown in this section, which are driven by the gate stacks GS2, GS3, GS6, GS7. The regions 60, 62, 63, 65 simultaneously serve as connection regions for the associated storage capacitors TK1-TK4. The regions 61 and 64 are in each case simultaneously associated with two adjacent selection transistors.

The gate stacks GS1, GS4, GS5, GS8 are associated with selection transistors in other rows of the memory cell matrix. The thin gate oxide designated by reference symbol 5 in the figures lies beneath the gate stacks GS1-GS8 on the semiconductor substrate 1. The gate stacks GS1 to GS8 are provided in strip-type fashion on the semiconductor substrate 1 and all have the same construction and also approximately the same size and the same spacing from one another.

In the process stage illustrated in FIG. 1, the gas stacks GS1 to GS8 have a lower layer 10 made of polysilicon and an overlying layer 20 made of tungsten silicide. A cap 30 made of silicon nitride is provided above that. The respective left-hand and right-hand sidewalls of the strip-type gate stacks GS1 to GS8 are uncovered in this stage.

The active regions 60 to 65 between the gate stacks GS1 to GS7 can expediently be introduced by self-aligned implantations between the gate stacks GS1 to GS8.

Figure 2:
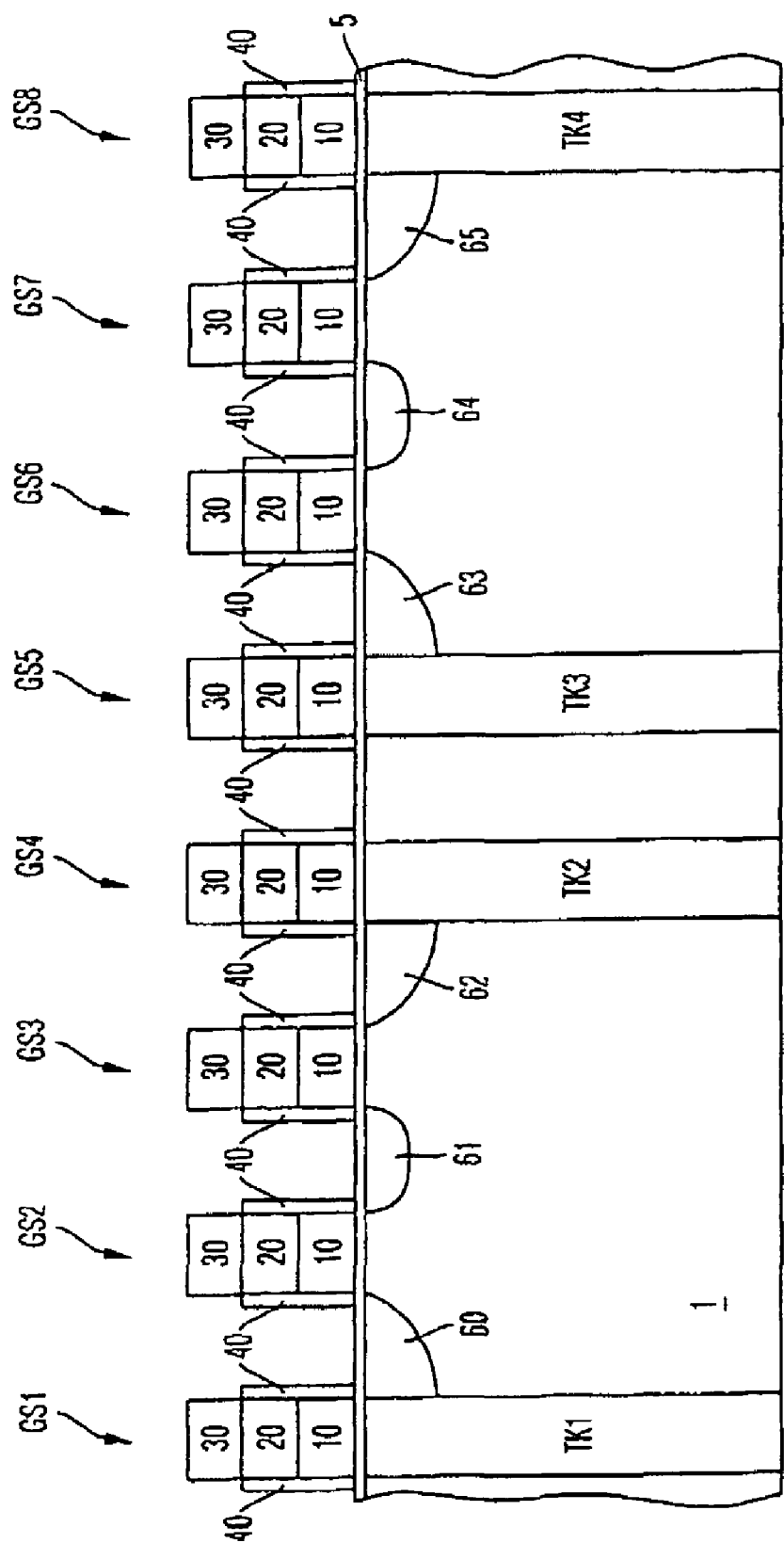

In the process step illustrated in FIG. 2, the two sidewalls of the gate stacks GS1 to GS8 are oxidized in order to form a customary sidewall oxide 40 having a thickness of typically 4-15 nm. This sidewall oxide 40 provides for electrical insulation for preventing short circuits between bit line and gate line.

Figure 3:
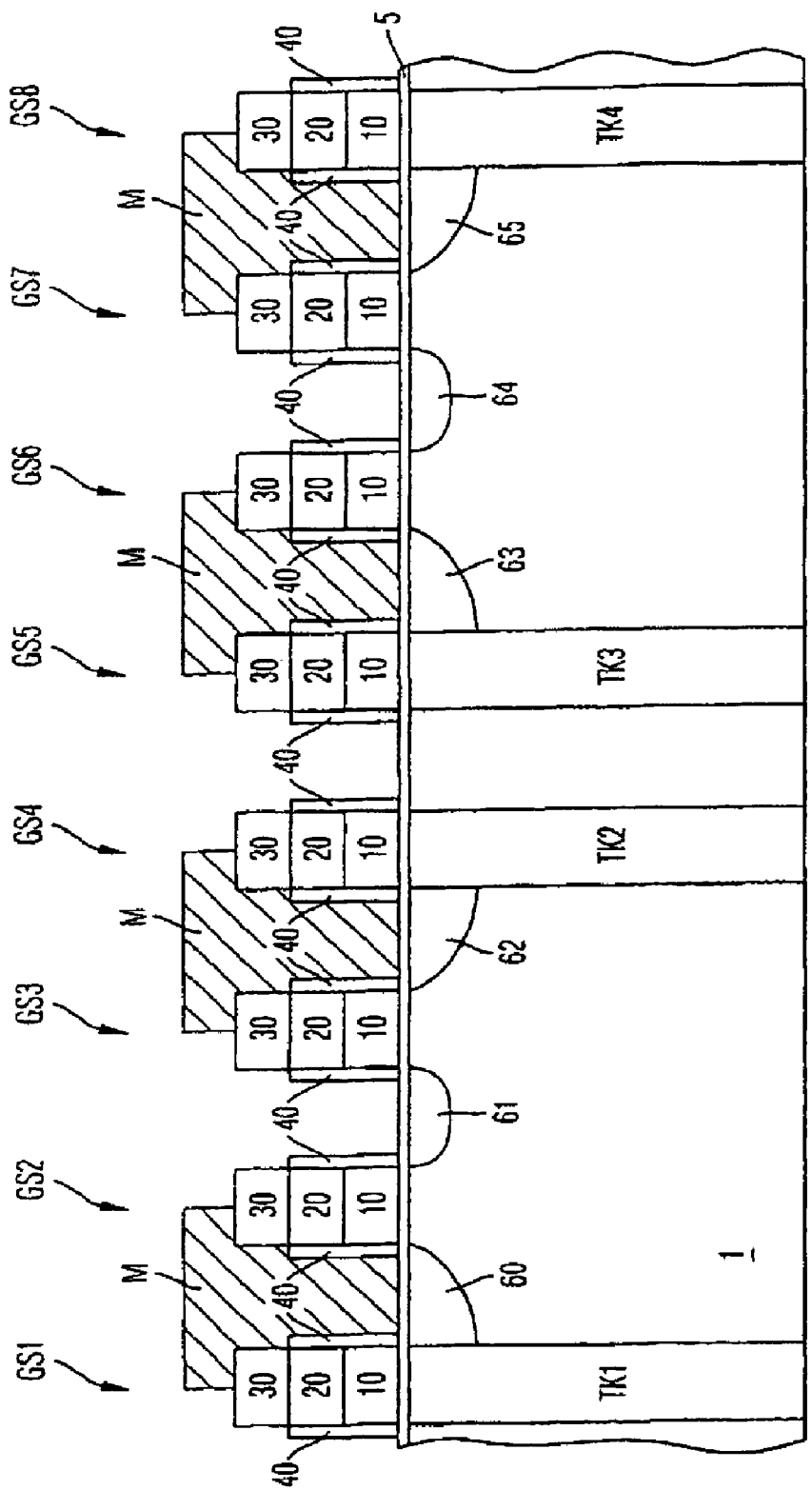

In the subsequent process step illustrated in FIG. 3, a mask M is applied to this structure, which mask is patterned in such a way that those sidewalls of the gate stacks which are remote from the trench capacitors are uncovered, which are associated in this section with the selection transistors for the relevant storage capacitors. They are the gate stacks GS2, GS3, GS7 and GS6 in the present case. Corresponding bit line contacts are later to be created between the gate stacks GS2, GS3 and GS7, GS6, respectively. In this section, no connection for a later bit line contact is situated between the gate stacks GS4, GS5 and on the left next to the gate stack GS1, and on the right next to the gate stack GS8, so that masking by the mask M is not necessary here but it would not, in principle, be a disturbance either.

Figure 4:
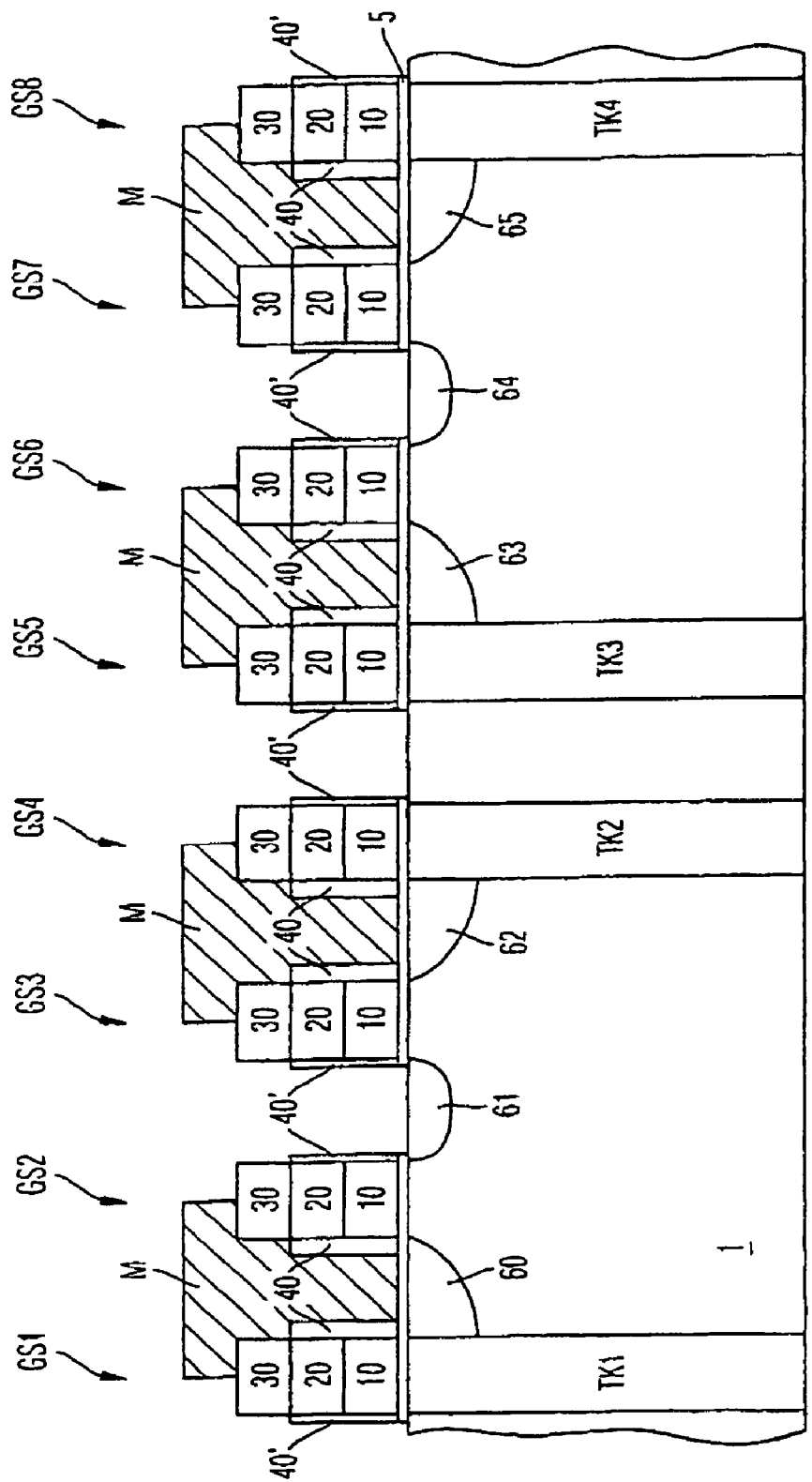

In the next process step shown in FIG. 4, the sidewall oxide 40 is thinned on the non-masked uncovered sidewalls of the gate stacks GS1, GS2, GS3, GS4, GS5, GS6, GS7, GS8, which leaves a sidewall oxide 40' thinned by approximately 50% on the relevant sidewalls.

This thinning of the sidewall oxide may be effected using a wet-chemical etching with a suitable oxide-etching solution, e.g. HF, diluted HF (DHF), buffered HF (BHF) or buffered oxide etch (BOE), or by means of a dry etching method, such as e.g. a reactive ion etching method.

In the course of the thinning process, the gate oxide present at the bottom between the relevant gate stacks is also reduced or removed, which does not have a disturbing effect.

It should be noted that in these regions between the gate stacks GS2, GS3 and between the gate stacks GS6, GS7 where the bit line contacts have to be produced later, more lateral space is available later as a result of the sidewall oxide being thinned on both sides.

Figure 5:
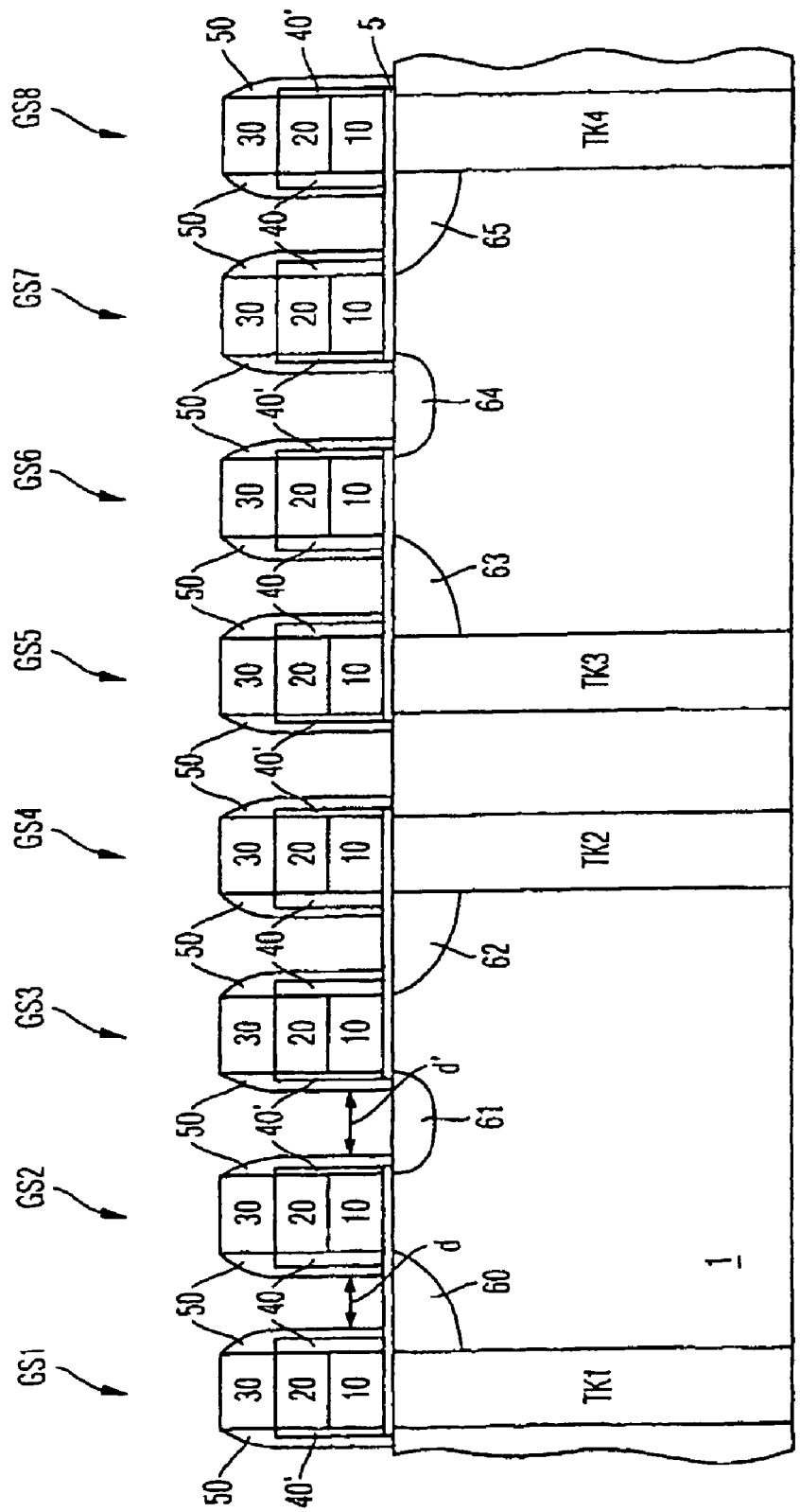

With reference to FIG. 5, finally, in a known manner, a respective sidewall spacer 50 made of silicon nitride is provided for the purpose of protecting the sidewall oxide 40 and the thinned sidewall oxide 40' during the later formation of the bit line contacts between the gate stacks GS2, GS3 and GS6, GS7 where, as a result of the thinning, there is a larger lateral width d' present in comparison with other intermediate regions without thinning.

The further steps for completing the memory cells are known in the prior art and, therefore, are not illustrated further here. In particular, as standard, firstly a liner made of silicon nitride is applied as a diffusion barrier, then a doped layer made of $SiO_2$ is deposited and planarized, and, finally, the bit line contact holes are etched in a self-aligned manner between the gate stacks GS2, GS3 and GS6, GS7 in the abovementioned two-stage etching process and the bit line contact is filled with a suitable metal, such as e.g. tungsten.

On account of the fact that the sidewall oxide is only reduced on the side remote from the storage capacitor, the leakage current behavior of the memory cells remains unchanged.

Although the present invention has been described above on the basis of a preferred exemplary embodiment, it is not restricted thereto, but rather can be modified in diverse ways.

In particular, the selection of the layer materials for the gate stacks and the arrangement thereof are only by way of example and can be varied in many different ways.

LIST OF REFERENCE SYMBOLS

1 Substrate
GS1-GS8 Gate stack
10 Polysilicon
20 Silicide
30 Silicon nitride
40, 40' Sidewall oxide
5 Gate dielectric
M Mask
60-65 Active regions
50 Sidewall spacer

What is claimed is:

1. A semiconductor structure comprising a plurality of gate stacks on a semiconductor substrate provided with a gate dielectric, the gate stacks having a lower first layer made of polysilicon, an overlying second layer made of a metal silicide, in particular a tungsten silicide, and an upper third layer made of an insulating material, and having a sidewall oxide on the sidewalls of the first and second layers, the sidewall oxide being thinned on one of those sidewalls and the sidewall oxide being intact on at least one other of those sidewalls, and the gate stacks having sidewall spacers made of said insulating material.

2. The structure of claim 1, wherein the insulating material is silicon nitride.

3. The structure of claim 1, wherein the sidewall spacers are formed on the sidewalls on the gate stacks.

4. The structure of claim 1, wherein the gate stacks serve as control electrodes for a respective selection transistor of a corresponding memory cell comprising a storage capacitor, and wherein the sidewall oxide is thinned on those sidewalls of the gate stacks which are remote from the associated storage capacitor.

* * * * *